United States Patent
Motomura

[11] Patent Number: 5,491,661
[45] Date of Patent: Feb. 13, 1996

[54] SEMICONDUCTOR STATIC RANDOM ACCESS MEMORY DEVICE HAVING PREVIOUSLY EQUALIZABLE MEMORY CELLS

[75] Inventor: Masato Motomura, Tokyo, Japan

[73] Assignee: NEC Corporation, Tokyo, Japan

[21] Appl. No.: 360,619

[22] Filed: Dec. 21, 1994

[30] Foreign Application Priority Data

Dec. 27, 1993 [JP] Japan ................................ 5-329348

[51] Int. Cl.$^6$ .................................................. G11C 13/00
[52] U.S. Cl. .................................... 365/230.01; 365/202
[58] Field of Search ............................. 365/230.01, 203, 365/202

[56] References Cited

U.S. PATENT DOCUMENTS

5,181,188  1/1993  Yamauchi ...................... 365/230.01

*Primary Examiner*—Terrell W. Fears
*Attorney, Agent, or Firm*—Sughrue, Mion, Zinn, Macpeak & Seas

[57] ABSTRACT

A semiconductor static random access memory device has a bi-stable memory cell for storing a data bit in the form of potential difference between two memory nodes, and an equalizing transistor is connected between the two memory nodes for equalizing the two memory nodes at a balance level between a high level and a low level before rewriting the data bit, thereby causing the bi-stable memory cell to swing the voltage levels at the two memory nodes by a half of the potential difference.

7 Claims, 7 Drawing Sheets

SEMICONDUCTOR STATIC RANDOM ACCESS MEMORY DEVICE HAVING PREVIOUSLY EQUALIZABLE MEMORY CELLS

FIELD OF THE INVENTION

This invention relates to a semiconductor static random access memory device and, more particularly, to a semiconductor static random access memory device having memory cells previously equalized at a certain voltage level before writing a new data bit.

DESCRIPTION OF THE RELATED ART

Figure 1:
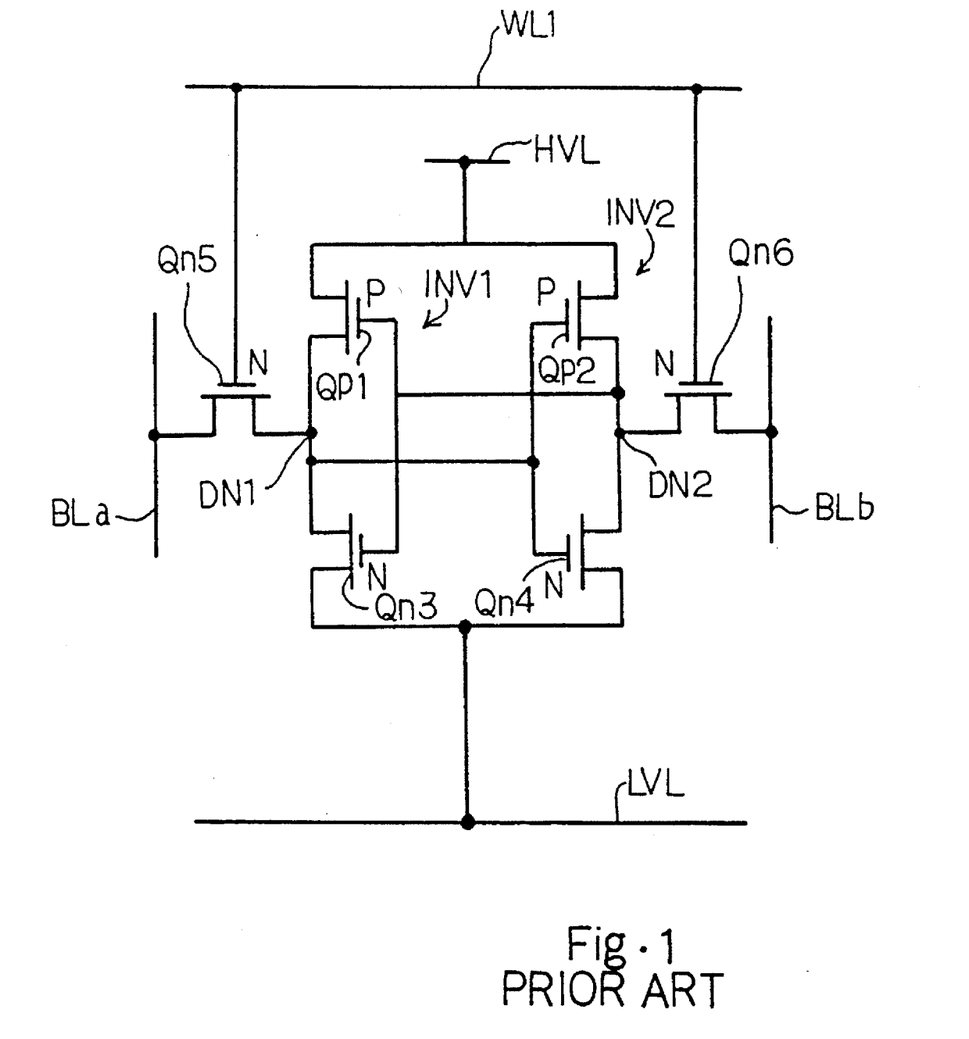
FIG. 1 is a circuit diagram showing the arrangement of the prior art static random access memory cell.

A typical example of the memory cell incorporated in the static random access memory device is illustrated in FIG. 1 of the drawings. The memory cell of the static random access memory device is hereinbelow referred to as "static random access memory cell". The prior art static random access memory cell comprises six field effect transistors Qp1, Qp2, Qn3, Qn4, Qn5 and Qn6. The p-channel enhancement type field effect transistor Qp1 and the n-channel enhancement type field effect transistor Qn3 form a complementary inverter INV1 coupled between a high voltage line HVL and a low voltage line LVL, and the p-channel enhancement type field effect transistor Qp2 and the n-channel enhancement type field effect transistor Qn4 also form another complementary inverter INV2 coupled between the high voltage line HVL and the low voltage line LVL. The n-channel enhancement type field effect transistor Qn5 is coupled between a bit line BLa and a common drain node DN1 in the complementary inverter INV1, and the n-channel enhancement type field effect transistor Qn6 is also coupled between a bit line BLb and a common drain node DN2 of the other complementary inverter INV2. The bit line BLb is paired with the bit line BLa, and the bit line pair propagates a potential difference indicative of a data bit from and to the prior art static random access memory cell. The data bit is stored at the common drain nodes DN1 and DN2 in the form of a potential difference.

The gate electrode of the p-channel enhancement type field effect transistor Qp1 and the gate electrode of the n-channel enhancement type field effect transistor Qn3 are coupled to the common drain node DN2, and the other common drain node DN1 is coupled to the gate electrode of the p-channel enhancement type field effect transistor Qp2 and the n-channel enhancement type field effect transistor Qn4. A word line WL1 is associated with the prior art static random access memory cell, and is coupled to the gate electrodes of the n-channel enhancement type field effect transistors Qn5 and Qn6.

When an external device is accessed to a data bit stored in the prior art static random access memory cell, the bit line BLa is equalized to the bit line BLb, and, thereafter, the word line WL1 is changed to a high level. The n-channel enhancement type field effect transistors Qn5 and Qn6 turn on, and the common drain nodes DN1 and DN2 are electrically connected through the n-channel enhancement type field effect transistors Qn5 and Qn6 to the bit lines BLa and BLb. The complementary inverters INV1 and INV2 not only maintain the potential difference between the common drain nodes DN1 and DN2 but also generates the potential difference between the bit lines BLa and BLb.

When a new data bit is stored in the prior art static random access memory cell, the word line WL1 is changed to the high level again, and a potential difference indicative of the write-in data bit is supplied to the bit line pair BLa/BLb. Then, the n-channel enhancement type field effect transistors Qn5 and Qn6 turn on, and the bit lines BLa and BLb are electrically connected to the common drain nodes DN1 and DN2.

If the write-in data bit is identical in logic level with the stored data bit, the complementary inverters INV1 and INV2 maintain the potential difference indicative of the stored data bit. On the other hand, if the write-in data bit is opposite in logic level to the stored data bit, the potential difference indicative of the write-in data bit causes the complementary inverters INV1 and INV2 to invert the potential difference between the common drain nodes DN1 and DN2. In a standard semiconductor static random access memory device, the high voltage line HVL and the low voltage line LVL supply a positive power voltage level and the ground voltage level to the prior art static random access memory cell, and the complementary inverters INV1 and INV2 are expected to widely swing the voltage levels at the bit lines BLa and BLb coupled to the common drain nodes DN1 and DN2.

One of the recent tendencies in the semiconductor technologies is a system-on-silicon, and the semiconductor static random access memory device is integrated on a monolithic silicon chip together with other system components. A microprocessor, an image processor and other signal processors are typical examples of the system-on-silicon technology. A plurality of memory units are, by way of example, incorporated in the microprocessor, and the static random access memory device serves as one of the memory units such as a cache memory unit. In the image processor, the static random access memory device may provide an image memory.

In any case, a data code is transferred between the static random access memory unit and a processing unit and between the static random access memory unit and another memory unit. The processor progressively increases data bits processed in parallel, and, accordingly, requires the static random access memory device to write or read the data bits in parallel. The static random access memory device consumes a large amount of electric power in the parallel write-in operation and the parallel read-out operation. For example, if write-in data bits are opposite in logic level to the stored data bits, the complementary inverters INV1 and INV2 of each static random access memory cell need to charge and discharge the associated first and second bit lines BLa and BLb, and consume a large amount of electric power. On the other hand, when the data bits are read out from the static random access memory cells in parallel, potential differences indicative of the read-out data bits are amplified by sense amplifier circuits. The sense amplifier circuits are expected to rapidly develop the potential differences, and are implemented by large-size transistors usually ten times larger than the component transistors of the static random access memory cells. This means that the sense amplifier circuits consume a large amount of electric power. If the data bits are transferred to another static random access memory device, write-in amplifiers produce potential differences from the multi-bit data signal again, and the electric power is further consumed.

Thus, reduction of the electric power consumption is one of the technical goals of the prior art semiconductor static random access memory device.

SUMMARY OF THE INVENTION

It is therefore an important object of the present invention to provide a semiconductor static random access memory device which is decreased in electric power consumption.

To accomplish the object, the present invention proposes to equalize a first memory node to a second memory node before writing new data.

In accordance with the present invention, there is provided a semiconductor static random access memory device selectively entering into a write-in phase and a read-out phase, comprising: a first bit line and a second bit line paired with each other for propagating a potential difference indicative of a data bit; a word line changed between an active level and an inactive level in both write-in and read-out phases; and a memory cell coupled to first and second sources of voltage level different in voltage level from each other, and having first and second memory nodes for storing the potential difference indicative of the data bit, a first switching means coupled between the first and second memory nodes and the first and second bit lines, respectively when the word line is changed to the active level, a second switching means coupled between the first and second memory nodes and the first and second sources of voltage level, and operative to selectively connect the first and second memory nodes to the first and second sources of voltage level depending upon a logic level of the data bit, and an equalizing means coupled between the first memory node and the second memory node and responsive to a balance control signal for equalizing a voltage level at the first memory node to a voltage level at the second memory node. The balance control signal may be supplied to the equalizing means before the change of the word line to the active level in the write-in phase.

BRIEF DESCRIPTION OF THE DRAWINGS

The features and advantages of the static random access memory cell and the semiconductor static random access memory device according to the present invention will be more clearly understood from the following description taken in conjunction with the accompanying drawings in which.

DESCRIPTION OF THE PREFERRED EMBODIMENTS

First Embodiment

Figure 2:
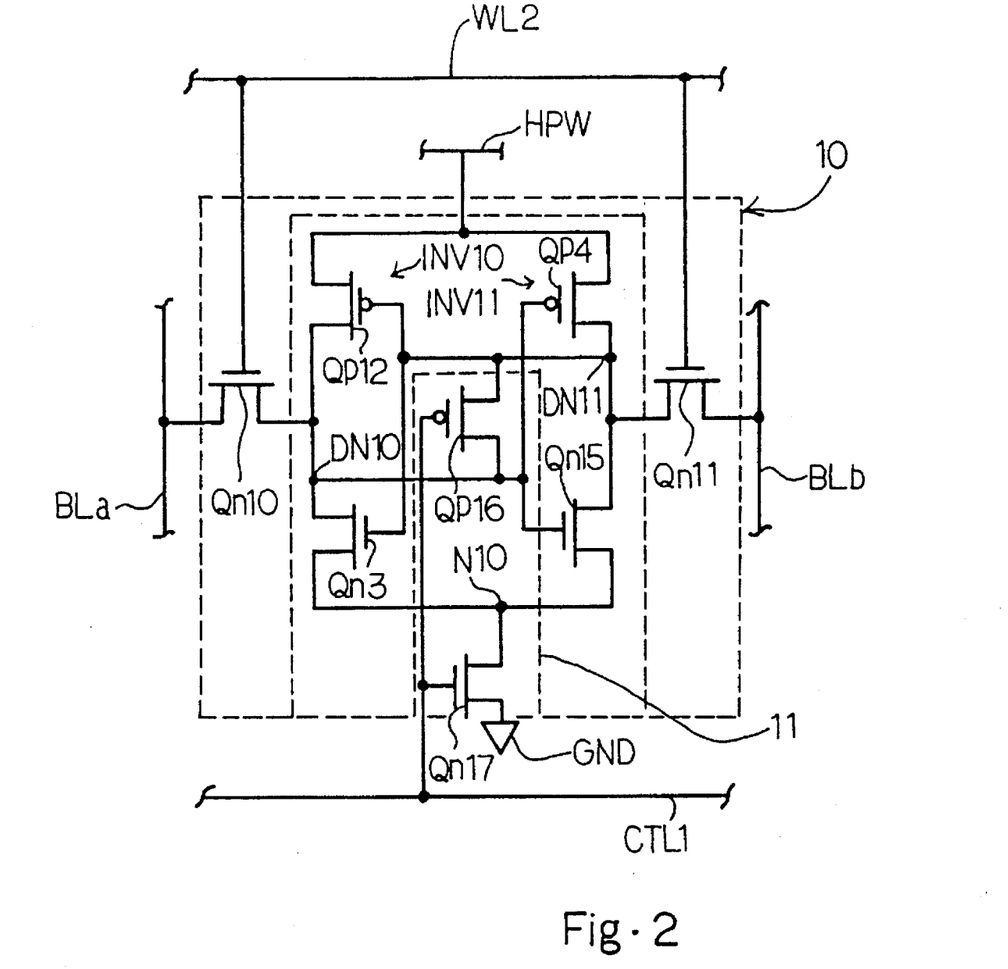
FIG. 2 is a circuit diagram showing the arrangement of a static random access memory cell according to the present invention.

Referring to FIG. 2 of the drawings, a static random access memory cell 10 embodying the present invention is associated with first and second bit lines BLa and BLb, a positive power voltage line HPW, a ground voltage line GND, a word line WL2 and a control signal line CTL1. The static random access memory cell 10 comprises two complementary inverters INV10 and INV11 coupled between the positive power voltage line HPW and a common discharging node N10, two n-channel enhancement type switching transistors Qn10 and Qn11 and an equalizing circuit 11.

The n-channel enhancement type switching transistor Qn10 is connected between the bit line BLa and a common drain node DN10 of the complementary inverter INV10, and the other n-channel enhancement type switching transistor Qn11 is connected between the bit line BLb and a common drain node DN11 of the complementary inverter INV11. The word line WL2 is connected to the gate electrodes of the n-channel enhancement type switching transistors Qn10 and Qn11, and concurrently turn on when the word line WL2 is changed to an active high level. The common drain nodes DN10 and DN11 serve as first and second memory nodes, and the n-channel enhancement type switching transistors Qn10 and Qn11 as a whole constitute a first switching means.

The complementary inverter INV10 is implemented by a series of a p-channel enhancement type field effect transistor Qp12 and an n-channel enhancement type field effect transistor Qn13, and the other complementary inverter INV11 is also implemented by a series of a p-channel enhancement type field effect transistor Qp14 and an n-channel enhancement type field effect transistor Qn15. The gate electrode of the p-channel enhancement type field effect transistor Qp12 and the gate electrode of the n-channel enhancement type field effect transistor Qn13 are connected to the common drain node DN11, and the other common drain node DN10 is connected to the gate electrode of the p-channel enhancement type field effect transistor Qp14 and the gate electrode of the n-channel enhancement type field effect transistor Qn15. Either p-channel or n-channel enhancement type field effect transistor Qp12/Qn13 connects the common drain node DN10 to one of the positive power voltage line HPW and the common discharging node N10 coupled to the ground voltage line GND, and either p-channel or n-channel enhancement type field effect transistor Qp14/Qn15 connects the common drain node DN11 to the other of the positive power voltage line HPW and the common discharging node N10 coupled to the ground voltage line GND. Therefore, the complementary inverters INV10 and INV11 as a whole constitute a second switching means.

The equalizing circuit 11 comprises a p-channel enhancement type switching transistor Qp16 connected between the common drain nodes DN10 and DN11 and an n-channel enhancement type switching transistor Qn17 connected between the common discharging node N10 and the ground voltage line GND. The control signal line CTL1 is connected to the gate electrode of the p-channel enhancement type switching transistor Qp16 and the gate electrode of the n-channel enhancement type switching transistor Qn17, and complementarily gates the p-channel enhancement type switching transistor Qp16 and the n-channel enhancement type switching transistor Qn17. The p-channel enhancement type switching transistor Qp16 equalizes the common drain node DN10 with the common drain node DN11 at a certain balance level lower than the positive power voltage level by a threshold thereof, and the n-channel enhancement type switching transistor Qn17 isolates the common discharging node N10 from the ground voltage line GND during the equalization of the common drain nodes DN10 and DN11.

The static random access memory cell 10 behaves in a read-out phase and a write-in phase as follow. In the read-out phase, a precharging circuit (not shown) firstly balances the bit line BLa with the bit line BLb, and, thereafter, the word line WL2 is changed to the active high level. Then, the n-channel enhancement type switching transistors Qn10 and Qn11 concurrently turn on, and the common drain nodes DN10 and DN11 are electrically connected through the n-channel enhancement type switching transistors Qn10 and Qn11 to the bit lines BLa and BLb. The control signal line CTL1 is maintained at the active high level in the read-out phase, and the p-channel enhancement type switching transistor Qp16 and the n-channel enhancement type switching transistor Qn17 are turned off and on, respectively. An accessed data bit is stored in the form of potential difference between the common drain nodes DN10 and DN11, and one of the p-channel enhancement type switching transistors Qp12 and Qp14 and one of the n-channel enhancement type switching transistors Qn13 and Qn15 turn on. The p-channel enhancement type switching transistor Qp12/Qp14 in the on-state charges the one of the bit lines BLa and BLb to the positive power voltage level, and the n-channel enhancement type switching transistor Qn13/Qn15 in the on-state discharges the other of the bit lines BLa and BLb through the n-channel enhancement type switching transistor Qn17 to the ground voltage level. As a result, a potential difference indicative of the stored data bit is generated between the bit lines BLa and BLb, and the bit lines BLa and BLb propagate the potential difference to a sense amplifier (not shown).

Assuming now that the stored data bit is rewritten in the write-in phase, a write-in circuit (not shown) generates a potential difference indicative of a write-in data bit, and the potential difference is supplied to the bit lines BLa and BLb.

The control signal line CTL1 is changed to the low level, and the p-channel enhancement type switching transistor Qp16 and the n-channel enhancement type switching transistor Qn17 respectively turn on and off. The n-channel enhancement type switching transistor Qn17 blocks the common discharging node N10 from the ground voltage level, and through-current does not flow through the static random access memory cell 10. The p-channel enhancement type switching transistor Qp16 equalizes the common drain nodes DN10 and DN11 at the certain balance level lower than the positive power voltage level by the threshold of the p-channel enhancement type switching transistor Qp16, and, accordingly, cancels the potential difference indicative of the stored data bit. The control signal line CTL1 is recovered from the low level to the high level, and the p-channel enhancement type switching transistor Qp16 and the n-channel enhancement type switching transistor Qn17 turn off and on. As a result, the common drain node DN10 is isolated from the common drain node DN11, and the common discharging node N10 is electrically connected to the ground voltage line GND again.

After the equalization between the common drain nodes DN10 and DN11, the word line WL2 is changed to the active high level, and the n-channel enhancement type switching transistors Qn10 and Qn11 concurrently turn on. Then, the n-channel enhancement type switching transistors Qn10 and Qn11 propagate the potential difference indicative of the write-in data bit to the common drain nodes DN10 and DN11, and one of the p-channel enhancement type switching transistors Qp12 and Qp14 and one of the n-channel enhancement type switching transistors Qn13 an Qn15 connect the common drain nodes DN10 and DN11 to the positive power voltage line HPW and the ground voltage line GND. The p-channel enhancement type switching transistor Qp12/Qp14 and the n-channel enhancement type switching transistor Qn13/Qn15 change and discharge the associated common drain nodes DN10 and DN11 from the certain balance level to the positive power voltage level and the ground voltage level. This means that only a small potential difference can rewrite the stored data bit, and the electric power consumption is drastically decreased.

Second Embodiment

Figure 3:
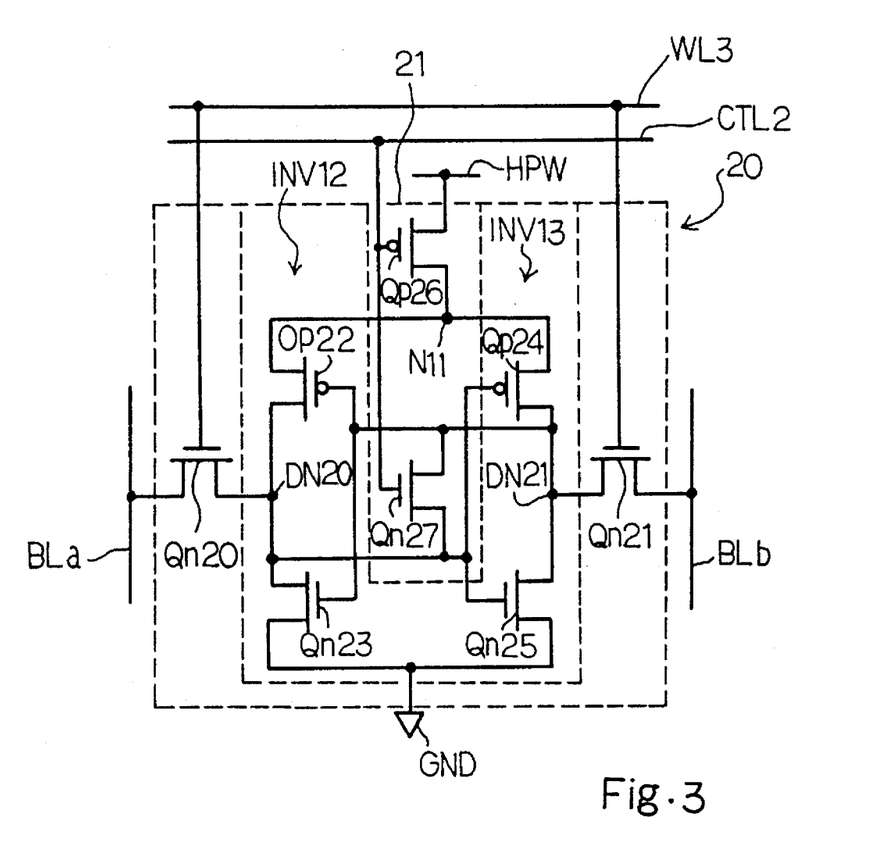
FIG. 3 is a circuit diagram showing the arrangement of another static random access memory cell according to the present invention.

Turning to FIG. 3 of the drawings, another static random access memory cell 20 embodying the present invention is associated with first and second bit lines BLa and BLb, a positive power voltage line HPW, a ground voltage line GND, a word line WL3 and a control signal line CTL2. The static random access memory cell 20 comprises two complementary inverters INV12 and INV13 coupled between a common charging node N11 and the ground voltage line GND, two n-channel enhancement type switching transistors Qn20 and Qn21 and an equalizing circuit 21.

The n-channel enhancement type switching transistor Qn20 is connected between the bit line BLa and a common drain node DN20 of the complementary inverter INV12, and the other n-channel enhancement type switching transistor Qn21 is connected between the bit line BLb and a common drain node DN21 of the complementary inverter INV13. The word line WL3 is connected to the gate electrodes of the n-channel enhancement type switching transistors Qn20 and Qn21, and concurrently turn on when the word line WL3 is changed to an active high level. The common drain nodes DN20 and DN21 serve as first and second memory nodes, and the n-channel enhancement type switching transistors Qn20 and Qn21 as a whole constitute a first switching means.

The complementary inverter INV12 is implemented by a series of a p-channel enhancement type field effect transistor Qp22 and an n-channel enhancement type field effect transistor Qn23, and the other complementary inverter INV13 is also implemented by a series of a p-channel enhancement type field effect transistor Qp24 and an n-channel enhancement type field effect transistor Qn25. The gate electrode of the p-channel enhancement type field effect transistor Qp22 and the gate electrode of the n-channel enhancement type field effect transistor Qn23 are connected to the common drain node DN21, and the other common drain node DN20 is connected to the gate electrode of the p-channel enhancement type field effect transistor Qp24 and the gate electrode of the n-channel enhancement type field effect transistor Qn25. Either p-channel or n-channel enhancement type field effect transistor Qp22/Qn23 connects the common drain node DN20 to one of the ground voltage line GND and the common charging node N11 coupled to the positive power voltage line HPW, and either p-channel or n-channel enhancement type field effect transistor Qp24/Qn25 connects the common drain node DN21 to the other of the ground voltage line GND and the common charging node N11 coupled to the positive power voltage line HPW. Therefore, the complementary inverters INV12 and INV13 as a whole constitute a second switching means.

The equalizing circuit 21 comprises a p-channel enhancement type switching transistor Qp26 connected between the positive power voltage line HPW and the common charging node N11 and an n-channel enhancement type switching transistor Qn27 connected between the common drain nodes DN20 and DN21. The control signal line CTL2 is connected to the gate electrode of the p-channel enhancement type switching transistor Qp26 and the gate electrode of the n-channel enhancement type switching transistor Qn27, and complementarily gates the p-channel enhancement type switching transistor Qp26 and the n-channel enhancement type switching transistor Qn27. The n-channel enhancement type switching transistor Qn27 equalizes the common drain nodes DN20 and DN21, and the p-channel enhancement type switching transistor Qp26 isolates the common charging node N11 from the positive power voltage line HPW during the equalization between the common drain nodes DN20 and DN21.

The static random access memory cell 20 behaves in a read-out phase and a write-in phase as follow. In the read-out phase, a precharging circuit (not shown) firstly balances the bit line BLa with the bit line BLb, and, thereafter, the word line WL3 is changed to the active high level. Then, the n-channel enhancement type switching transistors Qn20 and Qn21 concurrently turn on, and the common drain nodes DN20 and DN21 are electrically connected through the n-channel enhancement type switching transistors Qn20 and Qn21 to the bit lines BLa and BLb. The control signal line CTL2 is maintained at the active low level in the read-out phase, and the p-channel enhancement type switching transistor Qp26 and the n-channel enhancement type switching transistor Qn27 are turned on and off, respectively. An accessed data bit is stored in the form of potential difference between the common drain nodes DN20 and DN21, and one of the p-channel enhancement type switching transistors Qp22 and Qp24 and one of the n-channel enhancement type switching transistors Qn23 and Qn25 turn on. The p-channel enhancement type switching transistor Qp22/Qp24 in the on-state charges the one of the bit lines BLa and BLb to the positive power voltage level, and the n-channel enhancement type switching transistor Qn23/Qn25 in the on-state discharges the other of the bit lines BLa and BLb to the ground voltage level. As a result, a potential difference indicative of the stored data bit is generated between the bit lines BLa and BLb, and the bit lines BLa and BLb propagate the potential difference to a sense amplifier (not shown).

Assuming now that the stored data bit is rewritten in the write-in phase, a write-in circuit (not shown) generates a potential difference indicative of a write-in data bit, and the potential difference is supplied to the bit lines BLa and BLb.

The control signal line CTL2 is changed to the low level, and the p-channel enhancement type switching transistor Qp26 and the n-channel enhancement type switching transistor Qn27 respectively turn off and on. The p-channel enhancement type switching transistor Qp26 blocks the common charging node N11 from the positive power voltage line HPW, and through-current does not flow through the static random access memory cell 20. The n-channel enhancement type switching transistor Qn27 equalizes the common drain nodes DN20 and DN21 at a certain balance level higher than the ground voltage level by the threshold thereof, and, accordingly, cancels the potential difference indicative of the stored data bit. The control signal line CTL2 is recovered from the high level to the low level, and the p-channel enhancement type switching transistor Qp26 and the n-channel enhancement type switching transistor Qn27 turn on and off. As a result, the common drain node N20 is isolated from the common drain node DN21, and the common charging node N11 is electrically connected to the positive high voltage line HPW again.

After the equalization between the common drain nodes DN20 and DN21, the word line WL3 is changed to the active high level, and the n-channel enhancement type switching transistors Qn20 and Qn21 concurrently turn on. Then, the n-channel enhancement type switching transistors Qn20 and Qn21 propagate the potential difference indicative of the write-in data bit to the common drain nodes DN20 and DN21, and one of the p-channel enhancement type switching transistors Qp22 and Qp24 and one of the n-channel enhancement type switching transistors Qn23 an Qn25 connect the common drain nodes DN20 and DN21 to the positive power voltage line HPW and the ground voltage line GND. The p-channel enhancement type switching transistor Qp22/Qp24 and the n-channel enhancement type switching transistor Qn23/Qn25 charge and discharge and the associated common drain nodes DN20 and DN21 from the certain balance level to the positive power voltage level and the ground voltage level. This means that a small potential difference can rewrite the stored data bit, and the electric power consumption is decreased.

Semiconductor Memory Device

The static random access memory cells embodying the present invention form a part of a semiconductor static random access memory device, and are of the type shown in FIG. 2.

Figure 4:
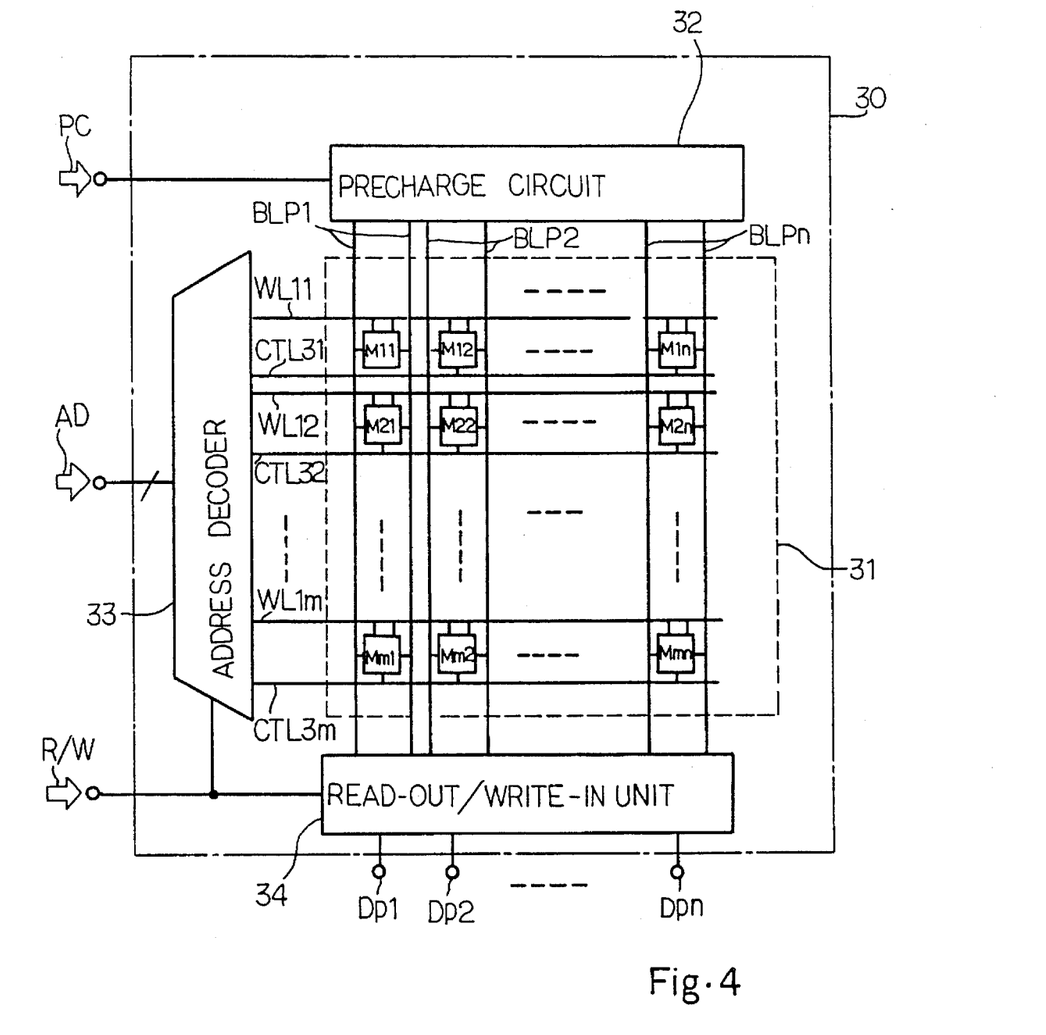
FIG. 4 is a block diagram showing a semiconductor static random access memory device according to the present invention.

FIG. 4 illustrates a first example of the semiconductor static random access memory device. The semiconductor static random access memory device is fabricated on a single semiconductor chip 30, and largely comprises a memory cell array 31, a plurality of bit line pairs BLP1, BLP2 and BLPn, a plurality of word lines WL11, WL12 and WL1m, a plurality of control signal lines CTL31 to CTL3m, a precharge circuit 32 connected to the bit line pairs BLP1 to BLPn, an address decoder 33 connected to the word lines WL11 to WL1m and the control signal lines CTL31 to CTL3m and a read-out/write-in unit 34 connected between the bit line pairs BLP1 to BLPn and a plurality of data pins DP1, DP2 and DPn.

The memory cell array 31 is implemented by the static random access memory cells M11 to M1n, M21 to M2n, .. . and Mm1 to Mmn arranged in rows and columns, and the rows of static random access memory cells M11 to Mmn are associated with the respective word lines WL11 to WL1m and the respective control signal lines CTL31 to CTL3m. On the other hand, the columns of static random access memory cells M11 to Mmn are respectively connected to the bit line pairs BLP1 to BLPn.

The precharge circuit 32 is responsive to a precharge control signal PC for charging the bit line pairs BLP1 to BLPn at a precharge level Vp lower than a positive power voltage level Vdd or a high level by a threshold of precharging transistors thereof.

A multi-bit address signal AD is supplied to the address decoder 33, and is decoded for changing one of the word lines WL11 to WL1m to an active high level. While the selected word line is maintaining at the active high level, the bit line pairs BLP1 to BLPn are coupled to the common drain nodes of the static random access memory cells connected thereto.

The read-out/write-in unit 34 is responsive to a read/write control signal R/W for changing the semiconductor static random access memory device between the read-out phase and the write-in phase. While the semiconductor static random access memory device is being in the read-out phase, the read-out/write-in unit 34 produces a multi-bit data signal from the potential differences on the bit line pairs, and the multi-bit data signal is supplied to the data output pins DP1 to DPn. The address decoder 33 maintains the control signal lines CTL31 to CTL3m to the inactive level, and the memory nodes of each static random access memory cell are electrically isolated from each other.

On the other hand, if the read/write control signal R/W is indicative of the write-in phase, the address decoder 33 selectively changes the control signal lines CTL31 to CTL3m to the low level, and the read-out/write-in unit 34 generates potential differences on the bit line pairs BLP1 to BLPn on the basis of a multi-bit input data signal at the data nodes DP1 to DPn.

Figure 5:
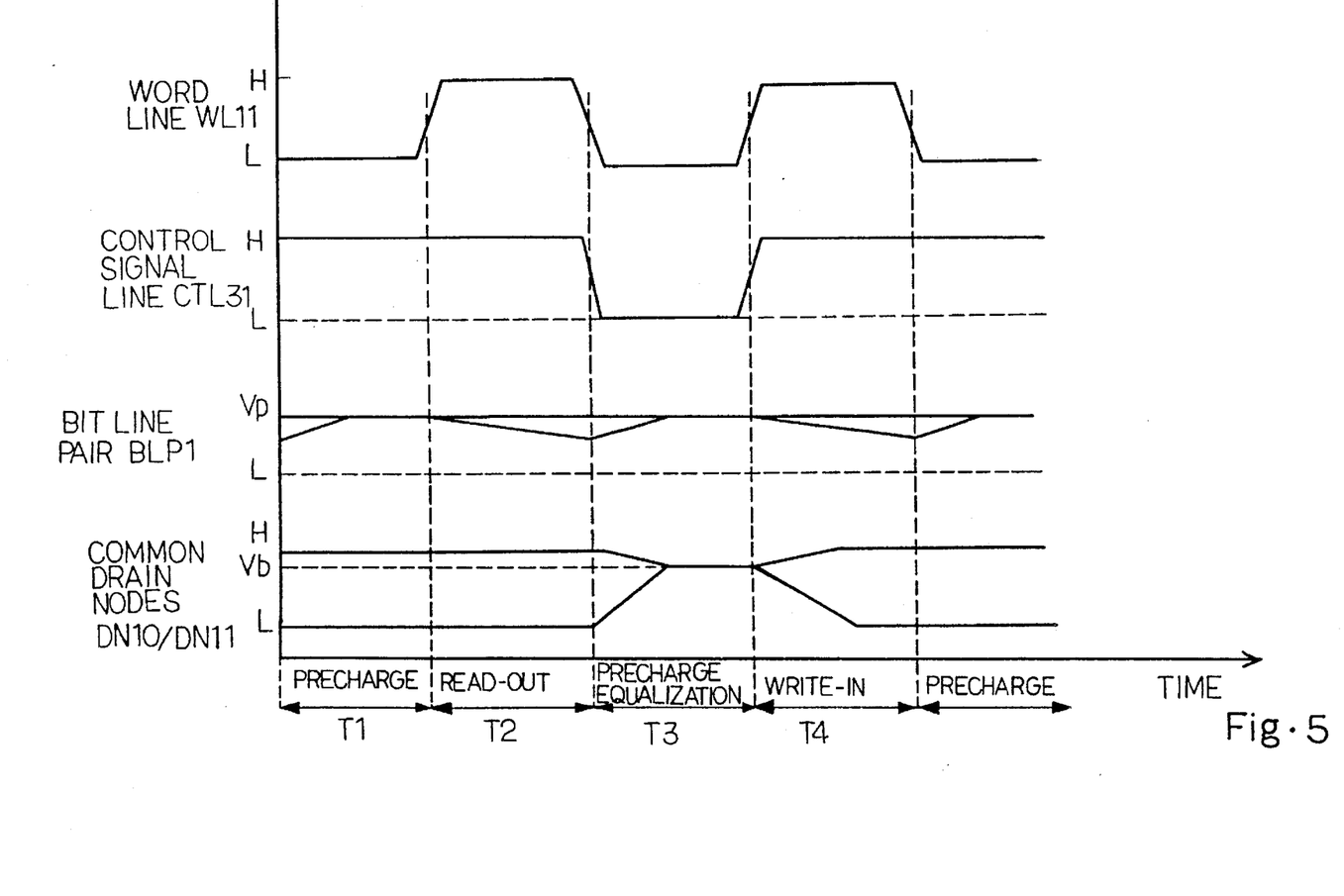
FIG. 5 is a timing chart showing a read-out cycle and a write-in cycle of the semiconductor static random access memory device according to the present invention.

Assuming now that the data bits stored in the static random access memory cells M11 M1n are accessed, the read/write control signal R/W shifts the semiconductor static random access memory device to the read-out phase, and the precharge control signal PC instructs the precharge circuit 32 to charge and balance the bit line pairs BLP1 to BLPn at the precharge level Vp. The precharge and balancing operation is completed in a first time period T1.

Subsequently, the address decoder 33 changes the word line WL11 to the active high level, and maintains the control signal lines CTL31 to CTL3m at the high level. Then, the pairs of common drain nodes DN10/DN11 of the static random access memory cells M11 to M1n are connected to the bit line pairs BLP1 to BLPn, and potential differences indicative of the accessed data bits are generated on the bit line pairs BLP1 to BLPn. The read-out/write-in unit 34 generates the multi-bit data signal from the potential differences, and the multi-bit data signal is supplied to the data nodes DP1 to DPn. The word line WL11 is recovered to the inactive low level, and the common drain nodes DN10/DN11 are not changed in the read-out phase T1 and T2.

The read/write control signal R/W is changed, and is indicative of the write-in phase. The precharge control signal PC instructs the precharge circuit 32 to charge and balance the bit line pairs BLP1 to BLPn at the precharge level Vp, and the address decoder 33 changes the control signal line CTL31 to the low level in a time period T3. The common drain nodes DN10 are equalized with the common drain nodes Dn11 at the balance level Vb.

The address decoder 33 concurrently changes the word line WL11 and the control signal line CTL31 to the high level. The word line WL11 turns on the n-channel enhancement type switching transistors Qn10 and Qn11 for electrically connecting the bit lines BLa/BLb to the common drain nodes DN10/DN11. On the other hand, the control signal line CTL31 causes the p-channel enhancement type switching transistors Qp16 and the n-channel enhancement type switching transistors Qn17 to turn off and on, respectively. As a result, the potential differences on the bit line pairs BLP1 to BLPn are propagated to the common drain nodes DN10/DN11, and one of the p-channel enhancement type switching transistors Qp12/Qp14 and one of the n-channel enhancement type switching transistors Qn13/Qn15 turn on so as to selectively connect the common drain nodes DN10/DN11 to the positive power voltage line HPW and the ground voltage line GND. Thus, the common drain nodes DN10/DN11 of each of the static random access memory cells M11 to M1n stores the potential difference between the positive power voltage level HPW and the ground voltage level GND in a time period T4.

Figure 6:
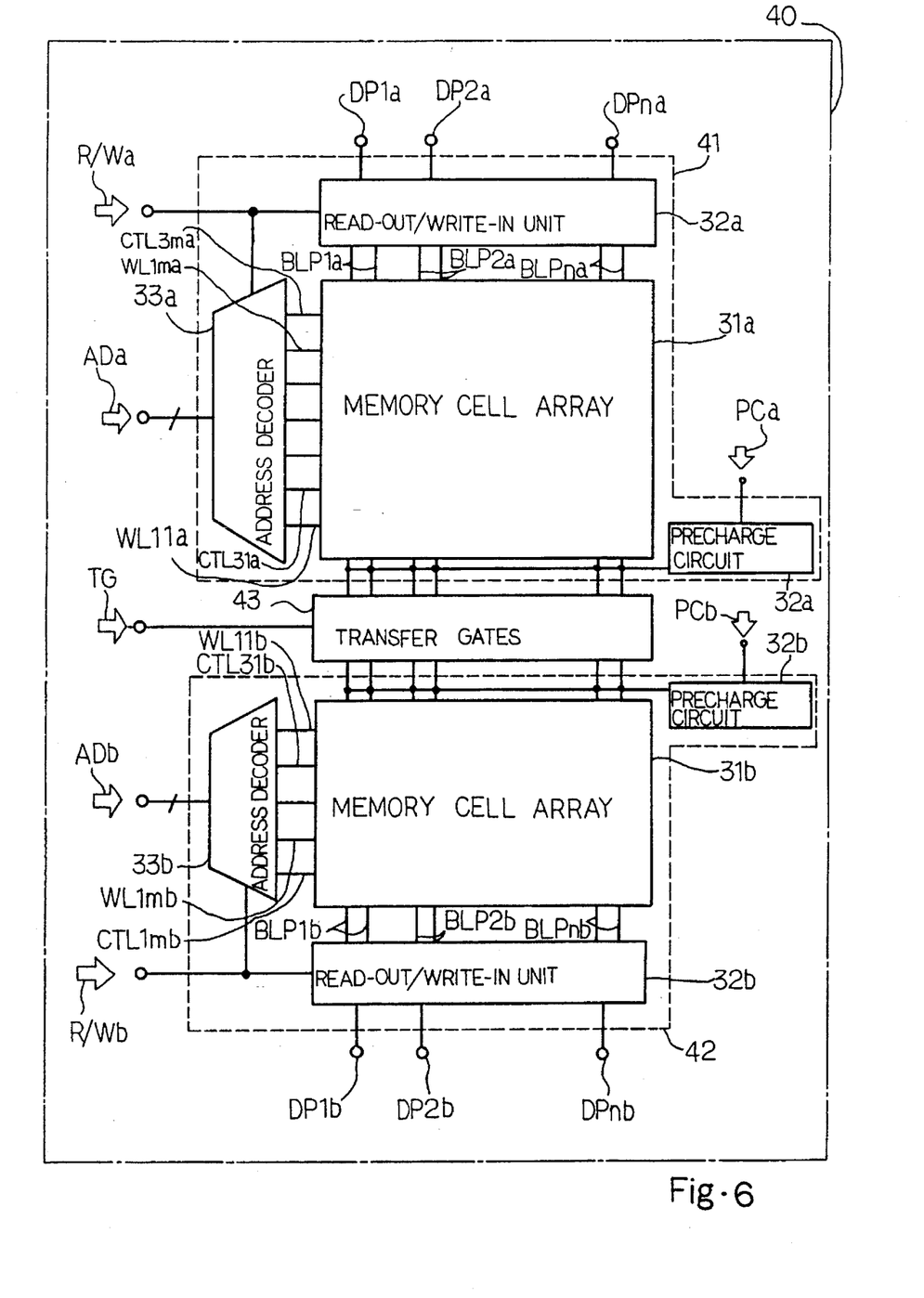
FIG. 6 is a block diagram showing another semiconductor static random access memory device according to the present invention.

Turning to FIG. 6 of the drawings, a semiconductor integrated circuit device embodying the present invention is fabricated on a single semiconductor chip 40, and two semiconductor static random access memories 41 and 42 and transfer gates 43 are incorporated in the semiconductor integrated circuit device. The two static random access memories 41 and 42 and the transfer gates 43 form parts of a microprocessor, by way of example. However, other function blocks are not illustrated in the figure.

The component units of the semiconductor static random access memory 41 are similar to those of the static random access memory device shown in FIG. 4, and are labeled with like reference numerals with a subscript "a". The component units of the semiconductor static random access memory 42 are labeled with like reference numeral with a subscript "b" without detailed description, because the component units are also similar to those of the semiconductor static random access memory device shown in FIG. 4.

The transfer gates 43 are connected between the bit line pairs BLP1a to BLPna and the bit line pairs BLP1b to BLPnb, and are responsive to a gate control signal TG of an active high level for transferring potential differences between the bit line pairs BLP1a to BLPna and the bit line pairs BLP1b to BLPnb.

The read/write operations on the memory cell array 31a and the read/write operations on the memory cell array 31b are similar to those of the semiconductor static random access memory device shown in FIG. 4, and the gate control signal TG is changed to the inactive low level for isolating the bit line pairs BLP1a to BLPna from the bit line pairs BLP1b to BLPnb.

On the other hand, while read-out data bits of one of the memory cell arrays 31a and 31b are being written into the other memory cell array 31b or 31a, the gate control signal TG causes the transfer gates 43 to turn on so as to connect the bit line pairs BLP1a to BLPna to the bit line pairs BLP1b to BLPnb.

Assuming now that the data bits are transferred between the row of static random access memory cells coupled to the word line WL11a to the row of static random access memory cells coupled to the word line WL11b, the control signal line CTL31a is maintained at the high level, and the control signal line CTL31b is changed to the low level in a time period T11. The bit lines BLP1a to BLPna and BLP1b to BLPnb are precharged to the balance level Vp in the time period T11 (see FIG. 7).

Figure 7:
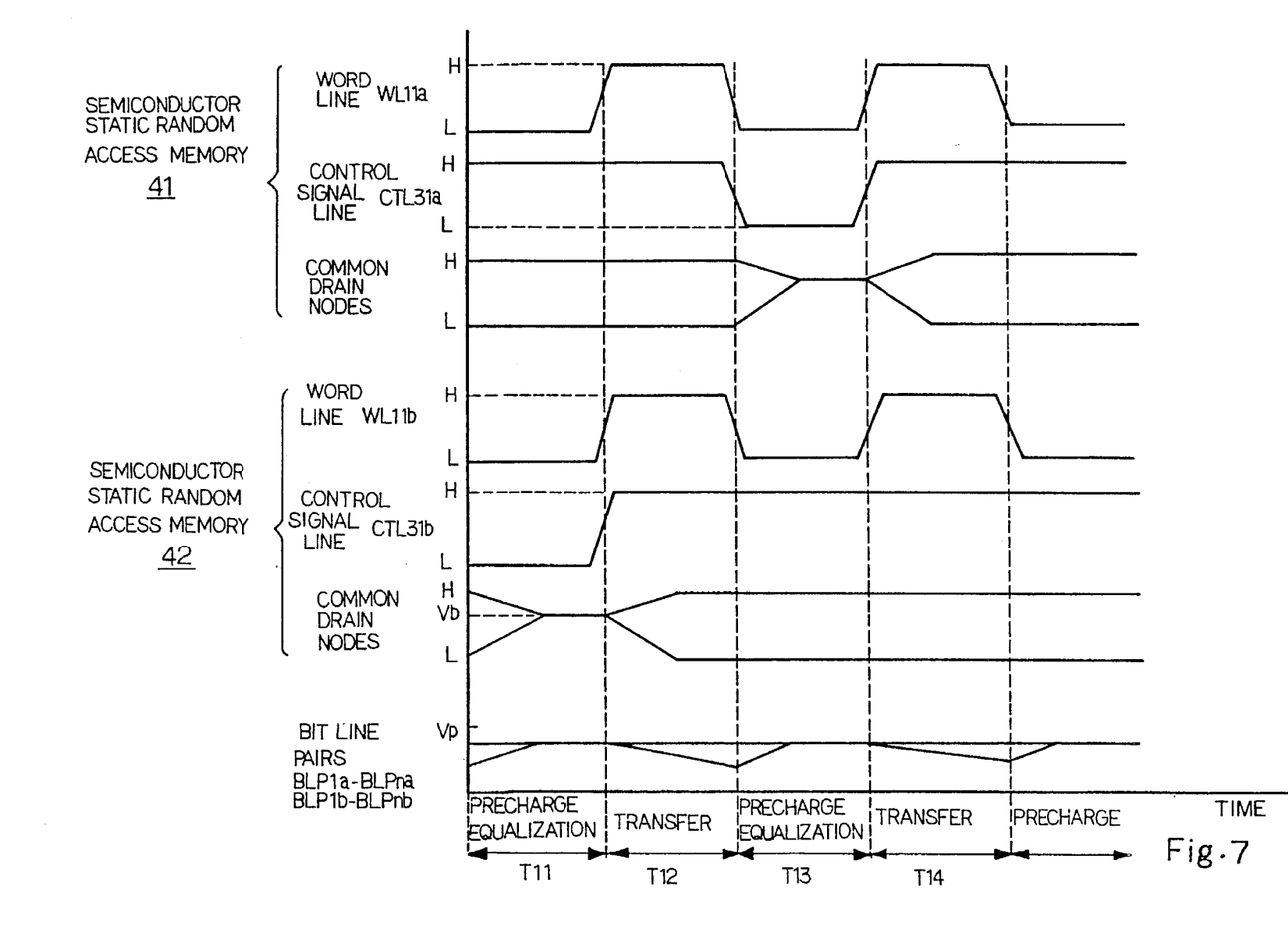
FIG. 7 is a timing chart showing a read-out cycle and a write-in cycle of the semiconductor static random access memory device.

The word lines WL11a and WL11b are changed to the high level, and the data bits are read out from the row of static random access memory cells connected to the word line WL11 a to the bit line pairs BLP1a to BLPna. The read-out data bits are transferred from the bit line pairs BLP1a to BLPna through the transfer gates 43 to the bit line pairs BLP1b to BLPnb, and stored in the row of memory cells connected to the word line WL11b. Thus, the data bits are transferred from the memory cell array 31a to the memory cell array 31b in a time period T12.

Subsequently, the control signal lines CTL31b is maintained at the high level, and the control signal line CTL31a is changed to the low level in a time period T13. The bit lines BLP1a to BLPna and BLP1b to BLPnb are precharged to the balance level Vp in the time period T13.

The word lines WL11a and WL11b are changed to the high level, and the data bits are read out from the row of static random access memory cells connected to the word line WL11b to the bit line pairs BLP1b to BLPnb. The read-out data bits are transferred from the bit line pairs BLP1b to BLPnb through the transfer gates 43 to the bit line pairs BLP1a to BLPna, and stored in the row of memory cells connected to the word line WL11a. Thus, the data bits are transferred from the memory cell array 31b to the memory cell array 31a in a time period T14.

As will be appreciated from the foregoing description, the equalizing unit equalizes the first memory node to the second memory node before writing a new data bit in the form of potential difference, and the first and second memory nodes are only changed from the equalized level to the high and low levels. This means that a small potential difference can rewrite the stored data bit, and the current consumption is drastically decreased.

Although particular embodiments of the present invention have been shown and described, it will be obvious to those skilled in the art that various changes and modifications may be made without departing from the spirit and scope of the present invention.

What is claimed is:

1. A semiconductor static random access memory device selectively entering into a write-in phase and a read-out phase, comprising:

a first bit line and a second bit line paired with each other for propagating a potential difference indicative of a data bit;

a word line changed between an active level and an inactive level in both write-in and read-out phases; and a memory cell coupled to first and second sources of voltage level different in voltage level from each other, and having first and second memory nodes for storing said potential difference indicative of said data bit, a first switching means coupled between said first and second memory nodes and said first and second bit lines, respectively when said word line is changed to said active level, a second switching means coupled between said first and second memory nodes and said first and second sources of voltage level, and operative to selectively connect said first and second memory nodes to said first and second sources of voltage level depending upon a logic level of said data bit, and an equalizing means coupled between said first memory node and said second memory node and responsive to a balance control signal for equalizing a voltage level at said first memory node to a voltage level at said second memory node.

2. The semiconductor random access memory device as set forth in claim 1, in which said balance control signal is supplied to the equalizing means before the change of said word line to said active level in said write-in phase.

3. The semiconductor random access memory device as set forth in claim 1, in which said first switching means comprises a first switching transistor connected between said first bit line and said first memory node and having a control node connected with said word line, and a second switching transistor connected between said second bit line and said second memory node and having a control node connected with said word line, said balance control signal being supplied to the equalizing means before the change of said word line to said active level in said write-in phase.

4. The semiconductor random access memory device as set forth in claim 1, in which said second switching means comprises two complementary inverters connected in parallel between a common node and one of said first and second sources of voltage level and having respective input nodes respectively connected to said first and second memory nodes and respective output nodes respectively connected to said second and first memory nodes, said balance control signal being supplied to the equalizing means before the change of said word line to said active level in said write-in phase.

5. The semiconductor static random access memory device as set forth in claim 1, in which said equalizing means comprises a first switching transistor connected between said first switching means and one of said first and second sources of voltage level and having a control node supplied with said balance control signal, and a second switching transistor connected between said first memory node and said second memory node and having a control node supplied with said balance control signal, said first switching transistor and said second switching transistor being complementarily switched between on-state and off-state.

6. The semiconductor static random access memory device as set forth in claim 1, in which said semiconductor static random access memory device serves as a first data storage fabricated on a single semiconductor chip together with at least another semiconductor static random access memory device similar in arrangement to said semiconductor static random access memory device and serving as a second data storage and a transfer unit coupled to said first and second bit lines of said first data storage and the first and second bit lines of said second data storage, said transfer unit being turned on while said data bit is being transferred between said first data storage and said second data storage, said transfer unit being turned off while said data bit is read out from and written into one of said first and second data storages.

7. A semiconductor static random access memory device selectively entering a write-in phase and a read-out phase, comprising:

a first bit line and a second bit line paired with each other for propagating a potential difference indicative of a data bit;

a word line changed between an active level and an inactive level in both write-in and read-out phases; and a memory cell having a first series combination of a first switching transistor of a first channel, conductivity type, a first memory node and a second switching transistor of a second channel conductivity type opposite to said first channel conductivity type, said first series combination being connected between a first source of power voltage level and a common node, said first and second switching transistor having respective gate electrodes connected to a second memory node, a second series combination of a third switching transistor of said first channel conductivity type, and a fourth switching transistor of said second channel conductivity type connected between said first source of power voltage level and said common node, said third and fourth switching transistor having respective gate electrodes connected to said first memory node, said potential difference being maintained between said first memory node and said second memory node, a fifth switching transistor of said second conductivity type connected, between said first bit line and said first memory node and having a gate electrode connected to said word line, a sixth switching transistor of said second channel conductivity type connected between said second bit line and said second memory node and having a gate electrode connected to said word line, a seventh switching transistor of said second channel conductivity type connected between said common node and a second source of voltage level different from said first source of voltage level and having a gate electrode supplied with a control signal, and an eighth switching transistor of said first channel conductivity type connected between said first memory node and said second memory node and having a gate electrode supplied with said control signal.

* * * * *

UNITED STATES PATENT AND TRADEMARK OFFICE
CERTIFICATE OF CORRECTION

PATENT NO. : 5,491,661
DATED : February 13, 1996
INVENTOR(S) : Masato Motomura

It is certified that error appears in the above-indentified patent and that said Letters Patent is hereby corrected as shown below:

Column 10, line 51, delete "WL11" and insert --WL11a--.

Signed and Sealed this

Sixteenth Day of July, 1996

Attest:

BRUCE LEHMAN

Attesting Officer     Commissioner of Patents and Trademarks